(12) United States Patent
Nash (10) Patent No.: US 9,750,167 B2
(45) Date of Patent: Aug. 29, 2017

(54) DATA TRANSMISSION BLOCKING HOLDER FOR PERSONAL DATA TRANSMITTING AND RECEIVING DEVICES

(75) Inventor: Michael Nash, Cary, IL (US)

(73) Assignee: Caged Idea's LLC, Cary, IL (US)

( * ) Notice: Subject to any disclaimer, the term of this patent is extended or adjusted under 35 U.S.C. 154(b) by 518 days.

(21) Appl. No.: 12/876,804

(22) Filed: Sep. 7, 2010

(65) Prior Publication Data

US 2012/0055824 A1 Mar. 8, 2012

(51) Int. Cl.
*B65D 85/00* (2006.01)
*H05K 9/00* (2006.01)
*H04B 1/3888* (2015.01)

(52) U.S. Cl.
CPC ......... *H05K 9/0045* (2013.01); *H05K 9/0047* (2013.01); *H04B 1/3888* (2013.01)

(58) Field of Classification Search
CPC ... H05K 9/0045; H05K 9/0047; H04B 1/3888
USPC ......... 206/320, 377, 459.1, 459.5, 725, 727, 206/203, 3, 314, 14, 305, 523, 719; 307/113; 362/37, 155; 232/5, 13; 63/1.18, 3.1
See application file for complete search history.

(56) References Cited

U.S. PATENT DOCUMENTS

| | | | |
|---|---|---|---|
| 2,156,462 A * | 5/1939 | Schulte | 362/191 |
| 3,181,693 A * | 5/1965 | Freistat | 206/523 |
| 4,494,651 A | 1/1985 | Malcolm | |
| 4,560,069 A * | 12/1985 | Simon | 206/591 |
| 5,041,838 A | 8/1991 | Liimatainen et al. | |
| 5,335,366 A | 8/1994 | Daniels | |
| 5,338,896 A | 8/1994 | Danforth | |
| 5,367,309 A | 11/1994 | Tashjian | |
| 5,550,552 A | 8/1996 | Oxley | |
| 5,594,200 A * | 1/1997 | Ramsey | 174/382 |
| 5,613,221 A | 3/1997 | Hunt | |
| 5,657,386 A | 8/1997 | Schwanke | |
| 5,777,261 A | 7/1998 | Katz | |

(Continued)

FOREIGN PATENT DOCUMENTS

DE 10 2005 061336 A1 6/2007

OTHER PUBLICATIONS

Cell Phone Stronghold Bag [online]. Identity Stronghold, 2009 [retrieved on Aug. 26, 2010]. Retrieved from the Internet: www.idstronghold.com/Cell-Phone-Stronghold-Bag/productinfo/IDSH6001%2D001/.

(Continued)

*Primary Examiner* — J. Gregory Pickett
*Assistant Examiner* — Rafael Ortiz
(74) *Attorney, Agent, or Firm* — K&L Gates LLP (57) ABSTRACT

A personal communication device ("PCD") holder includes: an at least semi-rigid housing having a base wall and at least one side wall extending from the base wall so as to form a housing into which a user can place a PCD, the base wall and the at least one side wall including a conductive material so that the base wall and the at least one side wall bock are data signal blocking; and a lid configured to be moveable with respect to the housing so as to enable the user to (i) place the PCD into the housing and (ii) securely and releasably close the lid onto the housing, the lid also including a conductive material so that when the lid is closed onto the housing, the holder is data signal blocking, preventing a data signal from reaching the PCD.

26 Claims, 5 Drawing Sheets

(56) References Cited

U.S. PATENT DOCUMENTS

| | | | |
|---|---|---|---|
| 5,811,050 A | 9/1998 | Gabower | |
| 5,819,162 A | 10/1998 | Spann et al. | |
| 6,029,804 A * | 2/2000 | Flynn | 206/14 |
| 6,075,977 A | 6/2000 | Bayrami | |
| 6,446,809 B2 * | 9/2002 | Flynn | 206/523 |
| 6,510,311 B1 | 1/2003 | Stitt | |
| 6,570,085 B1 | 5/2003 | Gabower | |
| 6,657,214 B1 * | 12/2003 | Foegelle et al. | 250/506.1 |
| 6,659,274 B2 * | 12/2003 | Enners | 206/305 |
| 6,738,650 B1 | 5/2004 | Zhou et al. | |
| 6,809,254 B2 | 10/2004 | Clement et al. | |
| 6,891,102 B2 | 5/2005 | Rashid | |
| 6,947,764 B2 | 9/2005 | Carillo, Jr. et al. | |
| 7,034,772 B2 | 4/2006 | Woodward | |
| 7,047,983 B2 | 5/2006 | Manougian et al. | |
| 7,134,552 B1 * | 11/2006 | McDonagh et al. | 206/545 |
| 7,162,285 B2 | 1/2007 | Owens et al. | |
| 7,171,248 B1 | 1/2007 | Brown | |
| 7,342,184 B2 | 3/2008 | Cochrane | |
| 7,358,447 B2 | 4/2008 | Gabower | |
| 7,482,925 B2 | 1/2009 | Hammad et al. | |
| 7,601,921 B2 | 10/2009 | Schroader | |
| 7,632,999 B2 * | 12/2009 | Wilkerson | 84/421 |
| 7,988,317 B2 * | 8/2011 | Kang | 362/155 |
| 8,203,850 B2 * | 6/2012 | Bouza et al. | 361/800 |
| 2002/0079240 A1 * | 6/2002 | Beard Kelley et al. | 206/232 |
| 2003/0057131 A1 * | 3/2003 | Diaferia | 206/719 |
| 2005/0029137 A1 * | 2/2005 | Wang | 206/320 |
| 2006/0196792 A1 * | 9/2006 | Barth et al. | 206/320 |
| 2007/0204742 A1 * | 9/2007 | Wilkerson | 84/329 |
| 2008/0000987 A1 | 1/2008 | Augustinowicz et al. | |
| 2009/0146862 A1 * | 6/2009 | Malone | 342/1 |
| 2009/0205985 A1 * | 8/2009 | Freeman et al. | 206/320 |
| 2010/0294675 A1 * | 11/2010 | Mangano | 206/5 |
| 2011/0011760 A1 * | 1/2011 | Habersetzer | 206/320 |
| 2011/0100865 A1 * | 5/2011 | Brink et al. | 206/581 |
| 2011/0198245 A1 | 8/2011 | Soufan | |

OTHER PUBLICATIONS

Communication Relating to the Results of the Partial International Search for International Application No. PCT/US2011/050549 mailed on Apr. 5, 2012.
International Preliminary Report on Patentability PCT/US2011/050549 dated Mar. 20, 2013.
Examination Report issued Feb. 13, 2014 for related Great Britain Appln. No. GB1306201.3.

* cited by examiner

DATA TRANSMISSION BLOCKING HOLDER FOR PERSONAL DATA TRANSMITTING AND RECEIVING DEVICES

BACKGROUND

The present disclosure relates to personal data transmitting and receiving devices, such as cellular phones, and more particularly to enclosures for same.

U.S. Pat. No. 7,601,921 discloses electromagnetic interference ("EMI") shielding containers. A need exists for an improved container as addressed by the devices disclosed herein.

SUMMARY

The present disclosure relates to data transfer blocking containers, keepers, housings, holders and protectors (collectively referred to herein as a "holder") for any type of personal communication device ("PCD") such as a cellular phone, electronic mail ("email") device, smart phone, personal computer and any combination thereof. There are many instances in which it is desirable to ensure that a person's PCD does not make a sound or even vibrate. Examples include courtrooms, meeting rooms, movies, plays, talks, seminars, etc. In certain of these examples, e.g., a courtroom or conference room, it is desirable for there to be a common data transfer blocking container, which ensures that everyone complies with the no interruption rule or request. Even people who try to comply with the rule or request can make a mistake that will result in their PCD ringing, vibrating or making some other type of disturbance. The holder of the present disclosure prevents disturbance even in the situation of a mistake.

In one primary embodiment of the present disclosure, the PCD holder is sized to hold a single PCD and is intended to be owned or controlled by an individual. The holder is in one preferred embodiment rigid or semi-rigid, such that the holder also serves to physically protect the user's PCD. The holder can for example be of a generally rectangular shape, wherein one wall of the holder is hingedly, slidingly or otherwise releasably attached to the remainder of the generally rectangular holder.

The rigid or semi-rigid walls can be made of any suitable organic or inorganic material, such as wood, metal, plastic and any combination thereof. The walls in any case are either formed of or have affixed a metal shell that encloses the PCD so that data (e.g., phone, email or text data) cannot be transmitted from or be received by the PCD. In one example, the holder is a metal holder, which is made of any suitable conductive material. Aluminum and copper and alloys thereof are two suitable examples. When the user places the PCD in the holder and closes its lid or door, any incoming calls, emails or texts will be blocked and not received. The blocked data transfer will be stored on the sender's server until the user removes the PCD from the holder, at which time the data transfer will be delivered to the PCD. Until then, the PCD is assured of not ringing, vibrating or otherwise making a disturbance. The metal walls can have a soft inner liner, such as foam or felt, so that the holder also provides drop or impact protection.

In another embodiment, the walls of the holder are made of plastic, epoxy or other polymeric material (referred to herein collectively as "synthetic" or "synthetic material"). The synthetic walls are rigid or semi-rigid and accordingly provide physical protection, including drop or impact protection. The synthetic walls are provided with a coating of conductive material (for example, aluminum, copper and alloys thereof), which can be applied via a suitable process, such as laminating, printing, spraying (e.g., in a conductive liquid form such as a conductive ink), sputtering or via any thin or thick film metallic application.

In still another technique, it is contemplated to impregnate the synthetic polymer with a high enough percent loading of conductive particles to allow the holder to block incoming data. The conductive layer can accordingly be continuous or discontinuous, e.g., granulated, perforated or of a mesh or foil. The conductive layer can be surrounded by the synthetic material, e.g., for corrosion prevention, or be located on the outside or inside surfaces of the walls of the holder.

Still further alternatively, it is contemplated to form a metal shell and to then apply the synthetic material. A metal shell can be formed, for example, from copper. A mandrel in the shape and size of the PCD is placed inside of the metal shell, after which the synthetic material is flowed into the metal shell and around the outside of the mandrel. After the synthetic material is cured, the mandrel is removed, leaving an opening sized and shaped to receive the PCD.

While many of the example holders shown below are rigid or semi-rigid, it is also contemplated to make a soft-shelled holder. An outer flexible shell can be made of a finishing material, such as vinyl, silicone, a fabric or other woven flexible material, such as a trampoline material. A metal, data-blocking shell is located inside the outer shell and can be a thin flexible foil or mesh screen. A foam insert can be located inside the metal shell to provide impact and drop protection. A top of the flexible holder can have a zipper or other releasable fastener to close the holder around the PCD.

As shown in detail below, the holders can be sized to hold a single PCD or multiple PCD's, e.g., for courtrooms, meeting rooms, auditoriums, hospital areas where sensitive equipment is used and the like. In an embodiment, the multi-compartment holder has an outer surface made of an aesthetically pleasing material, such as stained wood, colored synthetic material or polished metal. If wood or plastic, an inner layer is applied to the walls of the outer surface so as to create a common data blocking cage for each of the PCD's placed in the multi-compartment holder. The multi-compartment holder can have dividers for keeping the multiple PCD's separate from each other. The dividers can be plastic or covered with felt or other fabric to protect the PCD's from scratching. The dividers however do not necessarily have to provide metallic caging.

In one embodiment, the individual compartments of the multi-compartment holder are numbered and provided with a chip or marker bearing the same number. The chip or marker is given to the user who checks his or her PCD into the holder. The user then has to return the chip or marker to retrieve the PCD. This security feature is useful for a courtroom type of environment in which there are attendees that do not know each other. A meeting room or conference room may not need or use this security feature.

It is also contemplated to size the soft-shelled holder to be large enough to hold multiple PCD's.

It is accordingly an advantage of the present disclosure to provide a PCD holder that prevents the PCD from receiving or emitting a data signal.

It is another advantage of the present disclosure to provide a PCD holder that prevents the PCD from ringing, vibrating or causing a disturbance.

It is a further advantage of the present disclosure to provide a PCD holder that prevents the PCD from becoming scratched or nicked.

It is yet another advantage of the present disclosure to provide a PCD holder that provides impact or drop protection.

It is yet a further advantage of the present disclosure to provide a PCD holder that holds multiple PCD's.

Additional features and advantages are described herein, and will be apparent from the following Detailed Description and the figures.

DETAILED DESCRIPTION

Example Materials for the PCD's of the Present Disclosure

Referring now to the drawings and in particular to FIGS. 1 to 4, various embodiments of signal blocking, cage providing materials are illustrated. Any of the holders described herein can be made of any of the material configurations shown in FIGS. 1 to 4, alone or in combination with other materials. To that end, each of the material configurations shown in FIGS. 1 to 4 can be sized and configured to be rigid, semi-rigid or flexible.

Figure 1:
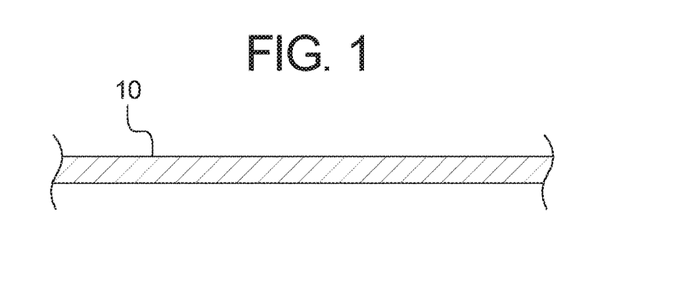
FIG. 1 is a sectioned elevation view of one suitable holder wall material for blocking the transmitting and receiving of a signal at a personal communication device ("PCD").

FIG. 1 shows a first material 10, which is a conductive wall. Suitable metals for material 10 include aluminum, copper and alloys thereof, however, it is contemplated to use other metals, alloys thereof and any material that allows electrons to flow. Conductive wall 10 can be of a single layer or multiple layers of the same or different conductive materials. Conductive wall 10 can be continuous, discontinuous, meshed or perforated. Suitable signal blocking materials include any conductive material. One suitable thickness range for metallic wall 10 is from several thousandths of an inch or less up to 0.250 inch (8 millimeters) or more.

Figure 2:
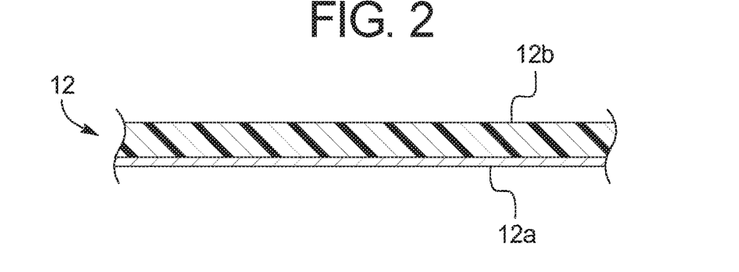
FIG. 2 is a sectioned elevation view of another suitable holder wall material of the present disclosure for blocking the transmitting and receiving of a signal at a PCD.

FIG. 2 shows a second material 12, which includes a conductive layer 12a applied to an electrically insulating layer 12b. Conductive layer 12a can be of any variety discussed above for conductive wall 10. Insulating layer 12b can be of any electrically insulating inorganic material, such as plastic, epoxy or other polymeric material (referred to herein collectively as "synthetic" or "synthetic material"). Insulating layer 12b can alternatively be of any electrically insulating organic material, such as wood.

In one embodiment, conductive layer 12a is laminated, printed, sprayed (e.g., in a conductive liquid form such as a conductive ink), sputtered or applied via any thin or thick film application to preexisting insulating layer 12b. In another embodiment, insulating layer 12b is laminated, printed or sprayed onto preexisting conductive layer 12a. In still another embodiment, conductive layer 12a and insulating layer 12b are both preexisting and are adhered, heat sealed and/or manually pressed together. Material 12 has an overall thickness in one embodiment of up to 0.250 inch (8 millimeters) or more.

Figure 3:
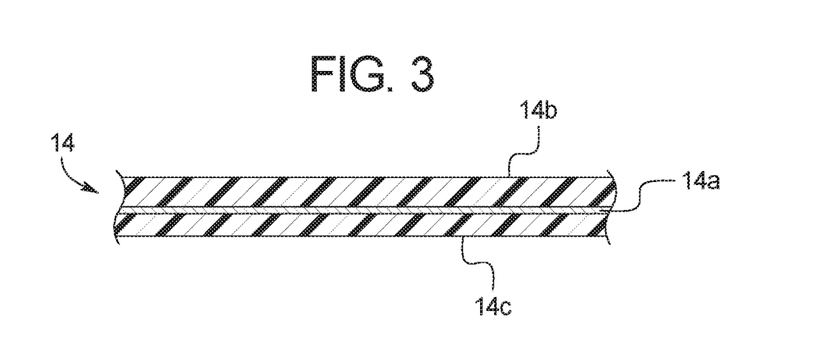
FIG. 3 is a sectioned elevation view of a further suitable holder wall material of the present disclosure for blocking the transmitting and receiving of a signal at a PCD.

FIG. 3 shows a third material 14, which includes a conductive layer 14a surrounded by two electrically insulating layers 14b and 14c. Conductive layer 14a can be of any variety discussed above for conductive wall 10. Insulating layers 14b and 14c can be of any variety discussed above for insulating layer 12b and can be the same as each other or of different varieties. Conductive layer 14a and either of insulating layers 14b and 14c are formed together via any of the methods discussed above for material 12. The second one of the insulating layers 14c or 14b is then applied to the open surface of conductive layer 14a via any of the methods discussed above for applying insulating layer 12b to conductive layer 12a, including the situation in which second insulating layer is a preexisting layer that at is adhered, heat sealed and/or press-fitted to the open surface of conductive layer 14a. In an alternative embodiment, it is contemplated to form the three layers 14a, 14b, and 14c together in an extrusion process. Material 14 has an overall thickness in one embodiment of up to 0.250 inch (8 millimeters) or more.

It is also contemplated for material 14 to include multiple conductive layers, such as, conductive layer 14a coupled to a single insulating layer, such as insulating layers 14b and 14c. It is further contemplated for material 14 to include multiple conductive layers, such as, conductive layer 14a coupled to a multiple insulating layers, such as insulating layers 14b and 14c. For example, two conductive layers could be sandwiched between three insulating layers. Any combination of even or odd conductive layers could be coupled to any combination of even and odd insulating layers. In still another alternative embodiment, multiple conductive layers, such as multiple ones of conductive layer 14a can be coupled together without any insulating layer. The multiple conductive layers can be of the same conductive material or of different materials. The multiple conductive layers can each be continuous or discontinuous, for example, a copper mesh coupled to an aluminum mesh.

Figure 4:
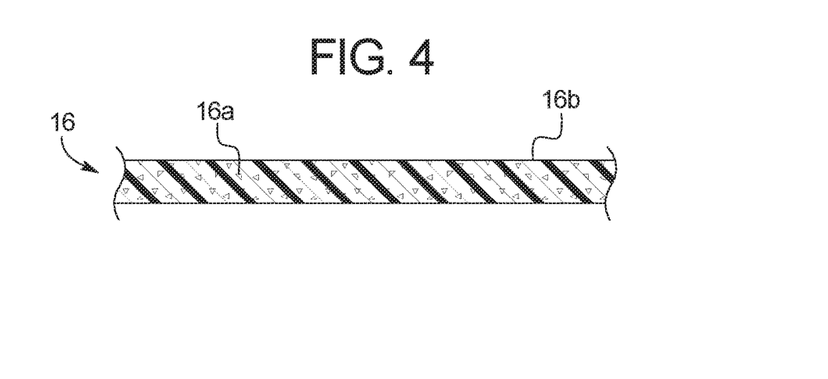
FIG. 4 is a sectioned elevation view of yet another suitable holder wall material of the present disclosure for blocking the transmitting and receiving of a signal at a PCD.

FIG. 4 shows a fourth material 16, which includes many conductive particles 16a impregnated into a polymeric, resin or otherwise synthetic base material 16b. Conductive particles 16a can be made of any material discussed above for conductive wall 10. Conductive particles 16a are loaded at a percentage within synthetic base 16b that is sufficient to provide a signal blocking, cage producing quality to material 16. Material 16 has a thickness in one embodiment of up to 0.250 inch (8 millimeters) or more.

Example PCD's of the Present Disclosure

Figure 5:
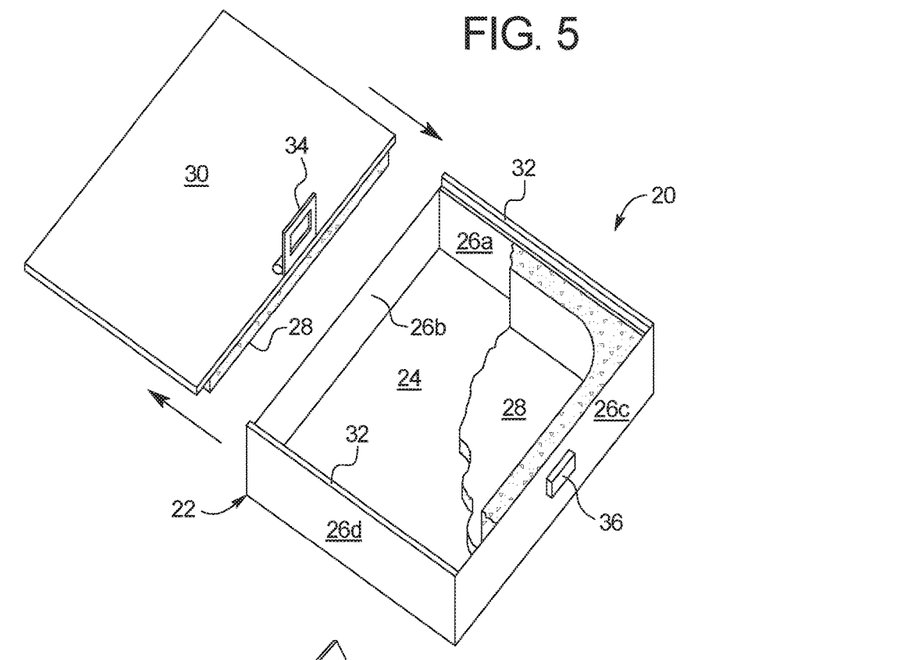
FIG. 5 is a perspective view of one embodiment of a PCD holder of the present disclosure.

Referring now to FIG. 5, a first embodiment of a signal blocking, cage providing personal communication device ("PCD") holder of the present disclosure is illustrated by sliding door holder 20. Holder 20 includes an open-walled housing 22, which includes base wall 24 and side walls 26a to 26d connected together to form a compartment for receiving a PCD. As mentioned above, walls 24 and 26a to 26d can be made of any of material configurations 10, 12, 14 and 16. It should also be appreciated that while holder 20 and the holders shown herein include multiple side walls, it is contemplated to provide an ovular or elliptical housing 12, which would have only a single side wall. In the illustrated embodiment, housing 22 is fitted with a foam or otherwise soft insert 28, which provides additional scratch resistance and drop/impact protection to holder 20. A foam or otherwise soft insert, such as insert 28, can be provided for any of the holders discussed herein.

Top wall 30 (which includes a mating portion of insert 28) is likewise made of any of material configurations 10, 12, 14 and 16 and can be the same or of a different material as housing 22. Top wall 30 in the illustrated embodiment is completely removable from housing 22 and slidingly engages housing 22 for closing and opening holder 20. In the illustrated embodiment side walls 26a and 26d each include a grooved slot 32 that is sized to snugly receive the upper and lower edges, respectively, of top wall 30. The height of front receiving side wall 26b extends to just below grooved slots 32. The height of rear receiving side wall 26c extends to the top of grooved slots 32, and has the same height as side walls 26a and 26d. Such arrangement enables holder 20 to at least virtually completely close around the user's PCD.

Top wall 30 includes or provides a hinged clip 34 that secures releasably to a catch 36 provided on wall 26c. After the user slides top wall 30 through grooved slots 32 all the way so that the leading edge of top wall 30 abuts against wall 26c, the user rotates clip 34 so that it locks to catch 36, which holds top wall 30 securely to housing 22. At this point, the user's PCD is enclosed within the metallic cage of holder 20 and cannot send or receive data signals, such as cellular phone, email, or text signals. Any data that is intended to be sent to the PCB is instead stored at the sending server until top wall 30 is removed and the PCB is activated for data retrieval.

Figure 6:
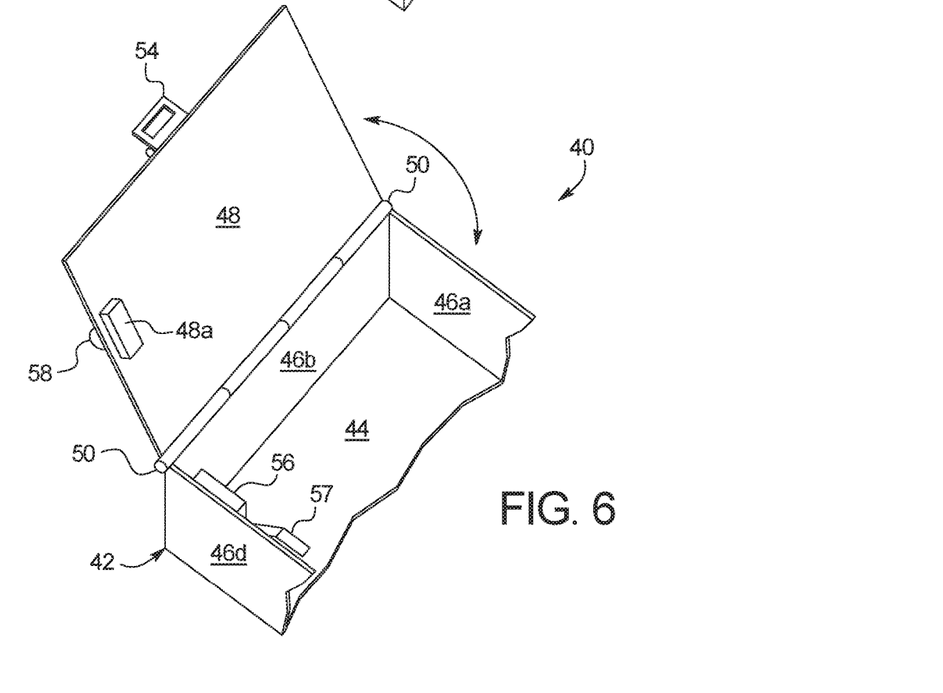
FIG. 6 is a perspective view of another embodiment of a PCD holder of the present disclosure.

Referring now to FIG. 6, a second embodiment of a signal blocking, cage providing PCD holder of the present disclosure is illustrated by hinged door holder 40. Holder 40 includes an open-walled housing 42, which includes base wall 44 and side walls 46a to 46d connected together to form a compartment for receiving a PCD. Walls 44 and 46a to 46d can be made of any of material configurations 10, 12, 14 and 16 discussed above. As with holder 20, housing 42 of holder 40 can be fitted with a foam or otherwise soft insert, such as insert 28 above, which provides additional scratch resistance and drop/impact protection to holder 40.

Hinged top wall 48 (which can include a mating portion of insert 28) is likewise made of any of material configurations 10, 12, 14 and 16 and can be the same or of a different material as housing 42. Hinged top wall 30 in the illustrated embodiment is hinged to housing 42 via a hinge 50, which can be any suitable hinge such as a piano hinge or a living hinge. In the illustrated embodiment, side walls 26a to 26d are each of the same height, such that holder 40 can at least virtually completely close around the user's PCD.

Hinged top wall 40 includes or provides a hinged clip 54 that secures releasably to a catch provided on the wall cutaway in FIG. 6 (which would be wall 46c analogous to wall 26c of holder 20). After the user rotates top wall 48 about hinge 50 all the way so that top wall 48 closes onto housing 42, the user rotates clip 54 so that it locks to the catch, which holds top wall 48 securely to housing 42. At this point, again, the user's PCD is enclosed within the metallic cage of holder 40 and cannot send or receive data signals, such as cellular phone, email, or text signals. Any data that is intended to be sent to the PCB is instead stored at the sending server until top wall 48 is rotated open about hinge 50 and the PCB is activated for data retrieval.

FIG. 6 also illustrates a feature that may be used with any of the PCD holders described herein, namely, a light emitting diode ("LED") or other type of illumination source that is illuminated when the PCD holder is closed and data signal blocking. In the illustrated embodiment, housing 42 is provided with an area to receive a rechargeable or non-rechargeable battery 56, such as a lithium, nickel-based or zinc-based battery. Multiple batteries 56 could be required. Battery 56 in an embodiment can be solar powered. In still a further alternative embodiment, illumination source 58 is powered by the PCD.

In the illustrated embodiment, power source or battery 56 is connected to a spring-loaded switch 57. Top wall 48 or lid 48 is provided with a projection 48a that maters with a contact end of spring-loaded switch 57 when top wall 48 or lid 48 is closed onto housing 42. Projection 48a causes the contact end of spring-loaded switch 57 to bend or rotate against the spring bias of spring-loaded switch 57, making an electrical contact within the switch. The making of the electrical contact causes illumination source 58 to illuminate, indicating that PCD holder 40 (or any of the holders discussed herein) is closed and data signal blocking. When top wall 48 or lid 48 is rotated away from housing 42, projection 48a releases from the contact end of spring-loaded switch 57, such that the spring bias of spring-loaded switch 57 causes the internal contact of switch 57 to become unmade and the illumination source to no longer illuminate. At this point, the user should expect their PCD to be able to send and receive data.

Figures 7, 8:
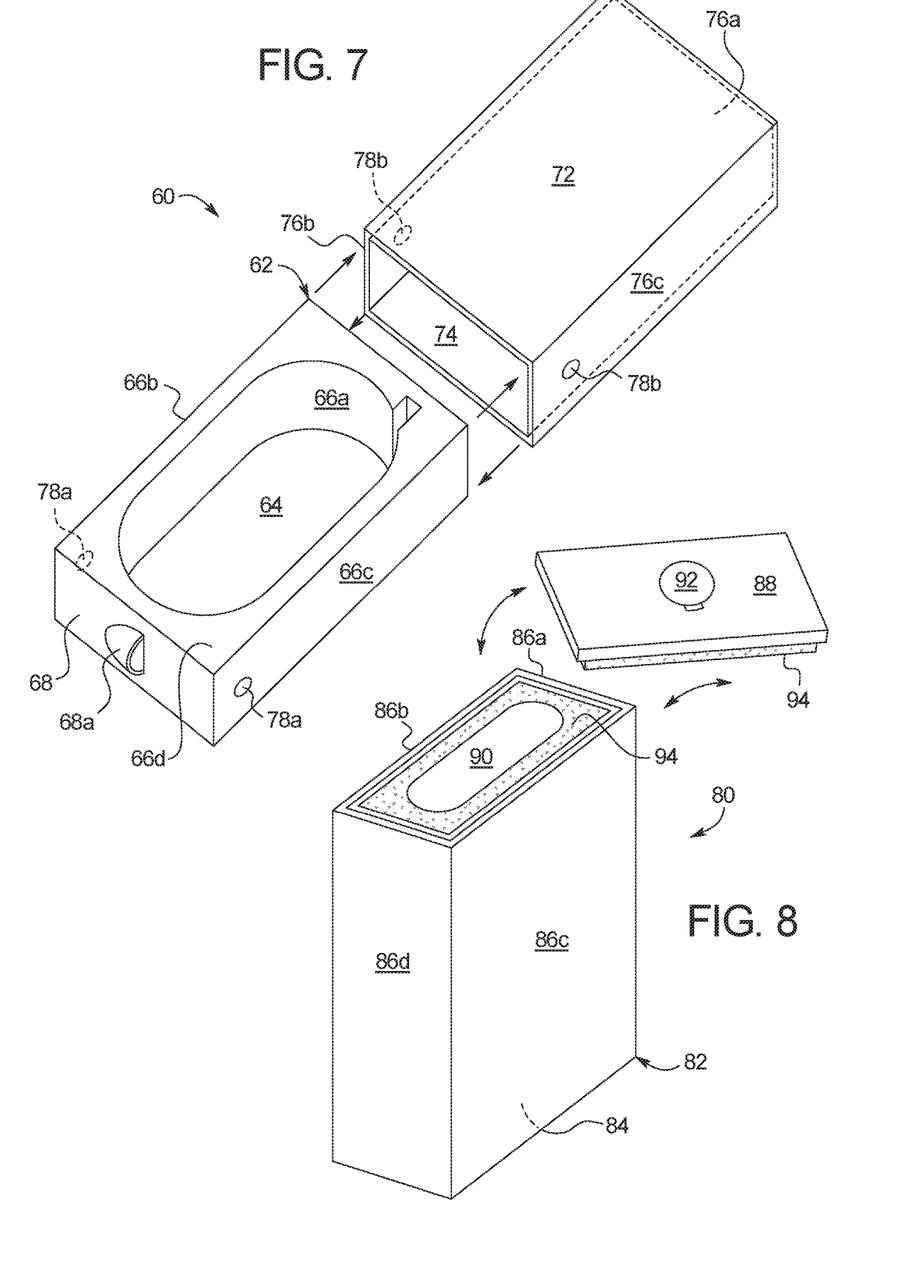
FIG. 7 is a perspective view of a further embodiment of a PCD holder of the present disclosure.
FIG. 8 is a perspective view yet another embodiment of a PCD holder of the present disclosure.

It should be readily apparent to those of skill in the art as to how power source or battery 56, switch 57 and illumination source 58, or similar structure could be modified for the sliding lid arrangement of FIG. 5, the sliding housings arrangement of FIG. 7, and the translating lid arrangement of FIG. 8. The hinged lid of the multi-compartment holder of FIG. 10 is very similar to that of FIG. 6. One or more LED's 58 can be illuminated to indicate that the multi-compartment holder of FIG. 10 is in a data signal blocking state. To that end, each holder of the present disclosure can use one or more LED's 58. The flexible arrangement of FIG. 9 could make electrical, illumination starting contact upon the full closing of its zipper or releasable elongated clasp.

Referring now to FIG. 7, a third embodiment of a signal blocking, cage providing PCD holder of the present disclosure is illustrated by holder 60. Holder 60 includes an open-walled housing 62, which includes base wall 64 and side walls 66a to 66d connected together to form a compartment for receiving a PCD. Walls 64 and 66a to 66d in one embodiment are formed as a single injection molded synthetic housing 62. Housing 62 is alternatively a soft or hard foam piece with the PCD shape cut or stamped out of the housing. Walls 64 and 66a to 66d in one embodiment have no metallic component and are not signal blocking. A signal blocking wall 68, which can be made of any of material configurations 10, 12, 14 and 16 discussed above is applied to, e.g., laminated to side wall 66d. Housing 62 of holder 60, being made of a synthetic or foam material, provides scratch resistance and drop/impact protection to holder 60.

Housing 62 is sized to slide snuggly into outer housing 70. Outer housing 70 includes a top wall 72, a base wall 74 and three side walls 76a to 76c, leaving an opening for receiving PCD carrying housing 62. Each of top wall 72, base wall 74 and side walls 76a to 76c is, like wall 68, signal blocking and made of any of material configurations 10, 12, 14 and 16 discussed above. Walls 66b and 66c of inner housing 62 are formed or provided with projections/detents 78a that snap-fittingly mate with detents/projection 78b formed or provided with walls 76b and 76c of outer housing 70 when inner housing 62 has been fully slid into outer housing 70. Projections/detents 78a and 78b releasably secure inner housing 62 inside of outer housing 70. A finger tab 68a or other suitable device is formed or provided with signal blocking wall 68 to aid the user in pulling inner housing 62 from outer housing 70 to retrieve the user's PCD.

When inner housing 62 is fully inserted into outer housing 70, holder 60 at least virtually completely closes around the user's PCD. At this point, again, the user's PCD is enclosed within the metallic cage of holder 60 and cannot send or receive data signals, such as cellular phone, email, or text signals. Any data that is intended to be sent to the PCB is instead stored at sending server until top wall 48 is rotated open about hinge 60 and the PCB is activated for data retrieval.

In an alternative version of holder 60, walls 66a to 66d of housing 62 and top wall 72 of outer housing 70 are signal blocking, while the remaining walls of outer housing 70 are not signal blocking. In this configuration, top wall 72 can be provided with indicia and/or projections/detents 78a and 78b and can be structured so that signal blocking top wall 72 is ensured to be slid over the PCD cutout of housing 62 (as opposed to the non-signal blocking wall 74). In a further alternative version of holder 60, walls 66a to 66d of inner housing 62 and walls 72 and 74 of outer housing 70 are both signal blocking walls, making proper insertion of inner housing 62 into outer housing 70 mistake proof.

Referring now to FIG. 8, a fourth embodiment of a signal blocking, cage providing PCD holder of the present disclosure is illustrated by translating door holder 80. Holder 80 includes an open-walled housing 82, which includes base wall 84 and side walls 86a to 86d connected together to form a compartment for receiving a PCD 90. Walls 84 and 86a to 86d are signal blocking and are made of any of material configurations 10, 12, 14 and 16 discussed above. As with holder 20, housing 82 of holder 80 can be fitted with a foam or otherwise soft insert, such as insert 28 above, which provides additional scratch resistance and drop/impact protection to holder 80. In one embodiment, housing 82 is made by constructing walls 84 and 86a to 86d, after which a mandrel is inserted into walls 84 and 86a to 86d. The mandrel has the shape of the PCD 90. Next, a synthetic, foam, sponge or other softer protective material 94 is sprayed, poured or otherwise flowed or placed inside walls 84 and 86a to 86d and around the mandrel. Once the protective material is cured or stabilized, the mandrel is removed, leaving an opening in the shape of, or larger than shape of PCD 90.

A top signal blocking wall 88 in the illustrated embodiment is configured to translate onto housing 82 and is sized to releasably but securely press-fit to housing 82. Top wall 88 is made of any of material configurations 10, 12, 14 and 16 discussed above. A knob, tab or other protrusion 92 is formed or provided with top wall 88 to aid the user in attaching and removing top wall 88 from housing 82. Top wall 88 can also include a foam or impact resisting material 94 on its underside. Top wall 88 can alternatively slide onto (e.g., like FIG. 5) or hinge to (e.g., like FIG. 6) housing 82.

When top wall 88 is secured to housing 82, holder 80 at least virtually completely closes around PCD 90. At this point, PCD 90 is enclosed within the metallic cage of holder 80 and cannot send or receive data signals, such as cellular phone, email, or text signals. Any data that is intended to be sent to the PCD is instead stored at the sending server until top wall 88 and PCD 90 are removed and the PCD is activated for data retrieval.

Figure 9:
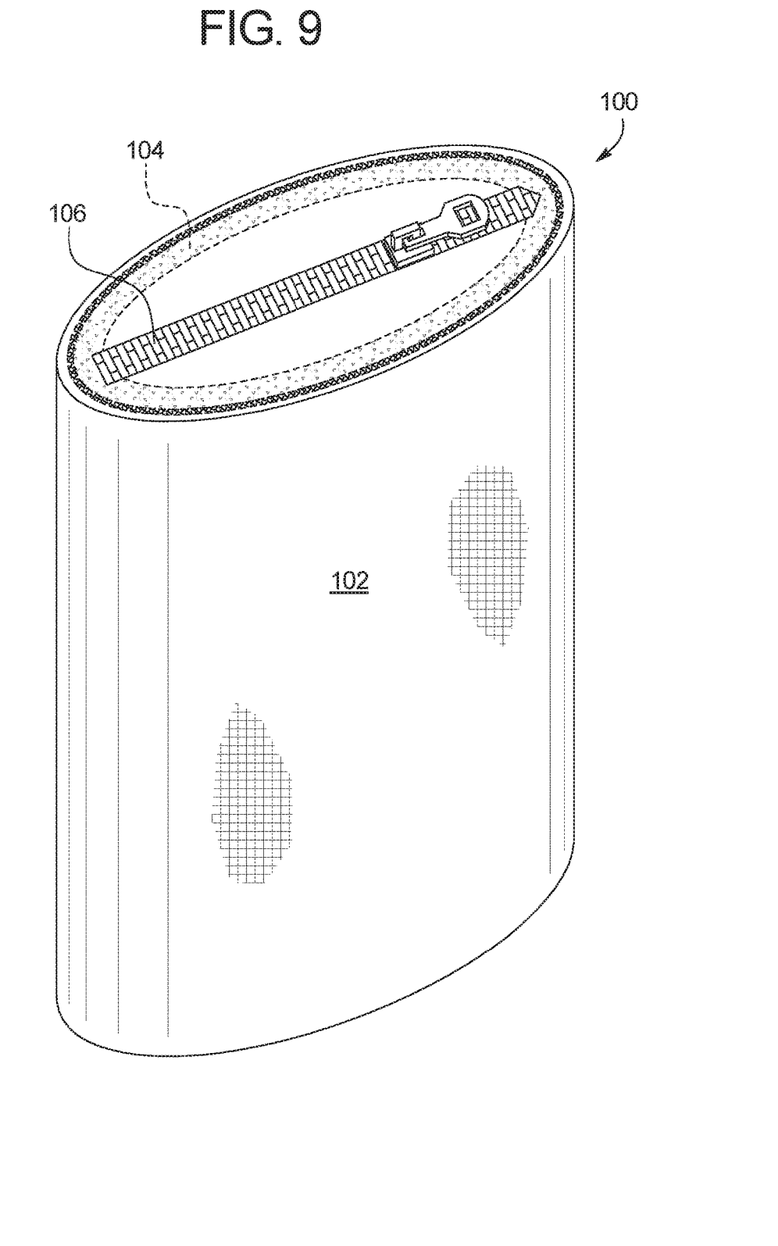
FIG. 9 is a perspective view one flexible PCD holder embodiment of the present disclosure.
Figure 10:
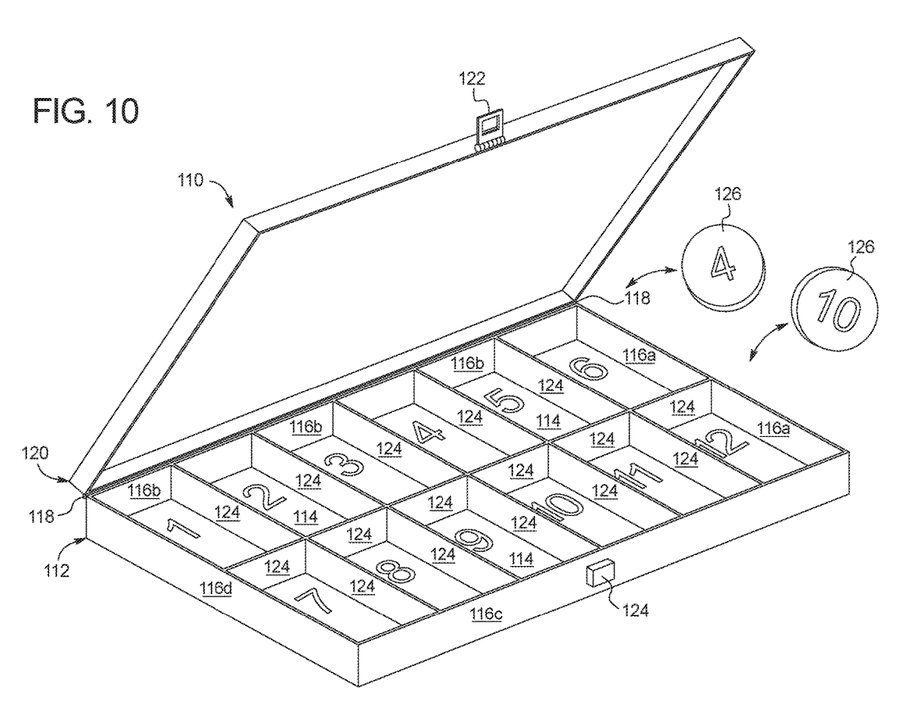
FIG. 10 is a perspective view one multiple PCD holder embodiment of the present disclosure.

Referring now to FIG. 9, one embodiment of a flexible holder is illustrated by holder 100. Flexible holder 100 is made of a flexible outer jacket 102, which can include any of the material configurations 10, 12, 14 and 16 discussed above. The outer surface of jacket 102 can have a vinyl, leather, cloth or other woven, mesh or trampoline surface, which is aesthetically pleasing. A foam, soft or sponge material 104 is placed inside jacket 102. Jacket 102 is also provides with a zipper 106 or other releasably securable device, which allows the user's PCD to be inserted and removed from holder 100.

Holder 100 completely closes around the user's PCD. At this point, again, the PCD is enclosed within the metallic cage of holder 100 and cannot send or receive data signals, such as cellular phone, email, or text signals. Any data that is intended to be sent to the PCD is instead stored at the sending server until the PCD is removed and activated for data retrieval.

Referring now to FIG. 10, one embodiment of a multi-compartment holder is illustrated by holder 110. Holder 110 includes a multi-compartment housing 112 having a common signal blocking lower wall 114 and common signal blocking side walls 116a to 116d. Each of lower wall 114 and common side walls 116a to 116d can be made of any of the signal blocking material configurations 10, 12, 14 and 16 discussed above.

A signal blocking lid 120 is shown hinged via hinge 118 (e.g., piano or living) to housing 112 but can alternatively, slide onto, fit over or press-fit onto housing 112 as has been shown herein. Signal blocking lid 120 can be made of any of the signal blocking material configurations 10, 12, 14 and 16 discussed above. Lid 120 includes one or more hinged locking tab 122 that releasably locks to catch 124 located on side wall 116c of housing 112 when lid is closed onto housing 112.

A non-signal blocking separator 124 is located inside housing 112. Separator 124 divides the space inside housing 112 into multiple individual PCD receiving compartments, here twelve compartments. In the illustrated embodiment, each compartment is given unique marking, number, image or indicium. A chip or marker 126 bearing a like marking, number, image or indicium is provided for each compartment. When multiple users place their PCD's into the compartments of multi-compartment holder 110, each user obtains the compartment's corresponding chip or marker 126. To ensure that the user retrieves the proper PCD from multi-compartment holder 110, the chip or marker 126 has to be returned to its compartment so that the PCD it currently houses can be returned to the proper owner.

In alternative multi-compartment holder embodiments, markers 126 and corresponding indicia are not provided. It is also contemplated to not provide separator 124. It should be appreciated that removing separator 124 allows enough space to place a user's personal computer, e.g., laptop or touch screen based computer. In another example, flexible holder 100 of FIG. 9 can be sized to hold multiple PCD's, e.g., without a separator. In any case, multi-compartment holder 100 completely closes around the users' PCD's. The PCD's are collectively enclosed within the metallic cage of holder 110 and cannot send or receive data signals, such as cellular phone, email, or text signals. Any data that is intended to be sent to any of the PCD is instead stored at the sending server until the corresponding PCD is removed and activated for data retrieval.

It should be appreciated that multi-compartment holder 110 does not need to be as mobile as the individual holders. Indeed, it may be desirable to bolt or otherwise make multi-compartment holder 110 generally immovable, for example, to prevent the multiple PCD's placed into multi-compartment holder 110 from getting jumbled or intermixed. This is desirable for the protection of the PCD's and the specific location security discussed above with markers 126. It is accordingly expressly contemplated to build multi-compartment holder 110 as a larger piece of furniture or structure, such as part of a cabinet, desk, panel, lectern or table. For example, many conference room tables are provided with imbedded, e.g., tabletop, drawers or holding areas supplying internet access ports and/or power plugs. One or more of the drawers or holding areas could be made to be data signal blocking via any of the materials and structural configurations discussed herein.

Additional Aspects of the Present Disclosure

Aspects of the subject matter described herein may be useful alone or in combination one or more other aspect described herein. Without limiting the foregoing description, in a first aspect of the present disclosure, a personal communication device ("PCD") holder includes: an at least semi-rigid housing having a base wall and at least one side wall extending from the base wall so as to form a housing into which a user can place a PCD, the base wall and the at least one side wall including a conductive material so that the base wall and the at least one side wall bock are data signal blocking; and a lid configured to be moveable with respect to the housing so as to enable the user to (i) place the PCD into the housing and (ii) securely and releasably close the lid onto the housing, the lid also including a conductive material so that when the lid is closed onto the housing, the holder is data signal blocking, preventing a data signal from reaching the PCD.

In accordance with a second aspect of the present disclosure, which may be used in combination with the first aspect, the lid is slideable with respect to the housing.

In accordance with a third aspect of the present disclosure, which may be used in combination with any one or more of the preceding aspects, the lid is hingedly connected to the housing.

In accordance with a fourth aspect of the present disclosure, which may be used in combination with any one or more of the preceding aspects, the lid is configured to be securely and releasably closed onto the at least one side wall.

In accordance with a fifth aspect of the present disclosure, which may be used in combination with any one or more of the preceding aspects, at least one of the base wall, the at least one side wall and the lid is a solid a conductive wall.

In accordance with a sixth aspect of the present disclosure, which may be used in combination with any one or more of the preceding aspects, at least one of the base wall, the at least one side wall and the lid includes a conductive layer attached to at least one synthetic layer.

In accordance with a seventh aspect of the present disclosure, which may be used in combination with any one or more of the preceding aspects, at least one of the base wall, the at least one side wall and the lid includes a metal-impregnated synthetic material.

In accordance with an eighth aspect of the present disclosure, which may be used in combination with any one or more of the preceding aspects, at least one of the base wall, the at least one side wall and the lid includes a conductive layer coupled to an organic material.

In accordance with a ninth aspect of the present disclosure, which may be used in combination with any one or more of the preceding aspects, the housing is a first housing, and wherein the lid is part of a second housing, the first housing slidingly engaging the second housing.

In accordance with a tenth aspect of the present disclosure, which may be used in combination with the ninth aspect, the lid is the only conductive material containing wall of the second housing.

In accordance with an eleventh aspect of the present disclosure, which may be used in combination with any one or more of the preceding aspects, the housing is formed by placing a mandrel inside of the base wall and the at least one side wall and inserting a synthetic material between the mandrel and the base and side walls.

In accordance with a twelfth aspect of the present disclosure, which may be used in combination with the eleventh aspect, the lid is translated onto and off of the housing and/or the mandrel is of a size at least as big as the PCD.

In accordance with a thirteenth aspect of the present disclosure, which may be used in combination with any one or more of the preceding aspects, the PCD holder includes an illumination source that becomes illuminated to indicate that the PCD holder is data signal blocking.

In accordance with a fourteenth aspect of the present disclosure, which may be used in combination with any one or more of the preceding aspects, the conductive material of the base wall, the at least one side wall and the lid is continuous, discontinuous, perforated or meshed.

In accordance with a fifteenth aspect of the present disclosure, which may be used in combination with any one or more of the preceding aspects, a personal communication device ("PCD") holder includes: a first housing having a base wall and a plurality of side walls extending from the base wall so as to form a housing into which a user can place a PCD, at least one of the sidewalls including a conductive material so that the at least one side wall bock is data signal blocking; and a second housing configured to be moveable with respect to the first housing so as to enable the user to (i) place the PCD into the first housing and (ii) releasably secure the second housing over the first housing, the second housing configured such that (a) the sidewall of the first housing that includes the conductive material is exposed when the second housing is releasably secured over the first housing and (b) each wall of the second housing that abuts a non-conductive material containing wall of the first housing when the second housing is releasably secured over the first housing includes a conductive material, such that combined first and second housings are data signal blocking.

In accordance with a sixteenth aspect of the present disclosure, which may be used with any one or more of the preceding aspects in combination with the fifteenth aspect, the exposed sidewall of the first housing includes an apparatus for grasping and pulling the first housing from the second housing.

In accordance with a seventeenth aspect of the present disclosure, which may be used with any one or more of the preceding aspects in combination with the fifteenth aspect, the first and second housings include mating structures for releasably securing the second housing to the first housing.

In accordance with an eighteenth aspect of the present disclosure, which may be used in combination with any one or more of the preceding aspects, a personal communication device ("PCD") holder includes: an at least semi-rigid housing having a base wall and at least one side wall extending from the base wall so as to form a housing sized such that multiple users can place their PCD's, the base wall and the at least one side wall including a conductive material so that the base wall and the at least one side wall bock are data signal blocking; and a lid configured to be moveable with respect to the housing so as to enable the users to (i) place the PCD's into the housing and (ii) securely and releasably close the lid onto the housing, the lid also including a conductive material so that when the lid is closed onto the housing, the holder is data signal blocking, preventing a data signal from reaching the PCD's.

In accordance with a nineteenth aspect of the present disclosure, which may be used with any one or more of the preceding aspects in combination with the eighteenth aspect, the housing includes a divider for compartmentalizing the multiple PCD's.

In accordance with a twentieth aspect of the present disclosure, which may be used with any one or more of the preceding aspects in combination with the eighteenth aspect, the PCD holder includes a plurality of markers, each user placing their PCD into the housing receiving one of the markers to use for retrieving their PCD and/or the PCD holder is provided as part of a larger piece of furniture or structure.

In accordance with a twenty-first aspect of the present disclosure, any of the structure and functionality illustrated and described in connection with FIG. 1 may be used in combination with any one or more of the preceding aspects.

In accordance with a twenty-second aspect of the present disclosure, any of the structure and functionality illustrated and described in connection with FIG. 2 may be used in combination with any one or more of the preceding aspects.

In accordance with a twenty-third aspect of the present disclosure, any of the structure and functionality illustrated and described in connection with FIG. 3 may be used in combination with any one or more of the preceding aspects.

In accordance with a twenty-fourth aspect of the present disclosure, any of the structure and functionality illustrated and described in connection with FIG. 4 may be used in combination with any one or more of the preceding aspects.

In accordance with a twenty-fifth aspect of the present disclosure, any of the structure and functionality illustrated and described in connection with FIG. 5 may be used in combination with any one or more of the preceding aspects.

In accordance with a twenty-sixth aspect of the present disclosure, any of the structure and functionality illustrated and described in connection with FIG. 6 may be used in combination with any one or more of the preceding aspects.

In accordance with a twenty-seventh aspect of the present disclosure, any of the structure and functionality illustrated and described in connection with FIG. 7 may be used in combination with any one or more of the preceding aspects.

In accordance with a twenty-eighth aspect of the present disclosure, any of the structure and functionality illustrated and described in connection with FIG. 8 may be used in combination with any one or more of the preceding aspects.

In accordance with a twenty-ninth aspect of the present disclosure, any of the structure and functionality illustrated and described in connection with FIG. 9 may be used in combination with any one or more of the preceding aspects.

In accordance with a thirtieth aspect of the present disclosure, any of the structure and functionality illustrated and described in connection with FIG. 10 may be used in combination with any one or more of the preceding aspects.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A personal communication device PCD holder comprising:
   an at least semi-rigid housing having a base wall and at least one side wall extending from the base wall so as to form a housing into which a user can place a PCD, at least one of the base wall and the at least one side wall including a conductive material so that the at least one of the base wall and the at least one side wall are data signal blocking;
   a lid configured to be moveable with respect to the housing so as to enable the user to (i) place the PCD into the housing and (ii) securely and releasably close the lid onto the housing, the lid also including a conductive material so that when the lid is closed onto the housing, the holder is data signal blocking, preventing a data signal from reaching the PCD;
   a separate material secured to and extending out from an interfacing edge of one of the housing and the lid so as to extend into the other of the lid and the housing when mated, the separate material (i) structured to have the same shape as an opening formed by the other of the lid and the housing and sized so as to fit snugly within each inner surface forming the opening and (ii) being conductive and data signal blocking, providing additional signal blocking protection between the lid and the housing; and
   an illumination source configured to illuminate when the lid is closed onto the housing to indicate the PCD holder is data signal blocking.

2. The PCD holder of claim 1, wherein the lid is slideable with respect to the housing.

3. The PCD holder of claim 1, wherein the lid is hingedly connected to the housing.

4. The PCD holder of claim 1, wherein the lid is configured to be securely and releasably closed onto the at least one side wall.

5. The PCD holder of claim 1, wherein at least one of the base wall, the at least one side wall and the lid is a rigid, bare metal wall having a thickness greater than one millimeter.

6. The PCD holder of claim 1, wherein at least one of the base wall, the at least one side wall and the lid includes a conductive layer attached to at least one synthetic layer.

7. The PCD holder of claim 1, wherein at least one of the base wall, the at least one side wall and the lid includes a metal-impregnated synthetic material.

8. The PCD holder of claim 1, wherein at least one of the base wall, the at least one side wall and the lid includes a conductive layer coupled to an organic material.

9. The PCD holder of claim 1, wherein the housing is a first housing, and wherein the lid is part of a second housing, the first housing slidingly engaging the second housing.

10. The PCD holder of claim 9, wherein the lid is the only conductive material containing wall of the second housing.

11. The PCD holder of claim 1, wherein the housing is formed by placing a mandrel inside of the base wall and the at least one side wall and inserting a synthetic material between the mandrel and the base and side walls.

12. The PCD holder of claim 11, wherein the lid is translated onto and off of the housing.

13. The PCD holder of claim 1, an wherein the illumination source configured such that when the lid is opened the illumination source stops illuminating to indicate that the PCD holder is no longer signal data blocking.

14. The PCD holder of claim 1, wherein the conductive material of the base wall, the at least one side wall and the lid is continuous, discontinuous, perforated or meshed.

15. A personal communication device PCD holder comprising:
 a first housing having a first wall and at least one side wall extending from the first wall so as to form an opening into which a user can place a PCD, each of the first wall and the at least one side wall including a conductive material, the first housing further including structure that is (a) sized based upon a size of the PCD and (b) structured inside the at least one side wall so as to form-fit to a shape of a particular PCD to inhibit movement of the PCD within the first housing, providing at least one of scratch and impact protection to the PCD; and
 a second housing having a base wall and at least one side wall extending from the base wall so as to form an open end bounded by the at least one side wall, the open end sized to receive only the two shortest of the length, width and height dimensions of the PCD so that the second housing receives the PCD in a tubular manner, the at least one side wall of the second housing including a conductive material, the second housing configured to be moveable with respect to the first housing so as to enable the user to (i) place the PCD into the first housing and (ii) releasably secure the open end of the second housing to the first housing, so that the PCD holder is data signal blocking, preventing a data signal from reaching the PCD.

16. The PCD holder of claim 15, wherein the first wall of the first housing includes an apparatus for grasping and pulling the first housing from the second housing.

17. The PCD holder of claim 15, wherein the first and second housings including mating structures for releasably securing the second housing to the first housing.

18. A personal communication device PCD holder assembly comprising:
 a plurality of PCD's;
 an at least semi-rigid housing having a base wall and at least one side wall extending from the base wall so as to form a housing, the housing including a divider such that multiple users can place and compartmentalize their PCD's into the housing, the base wall and the at least one side wall including a conductive material so that the base wall and the at least one side wall are data signal blocking, the divider (i) being non-conductive and not signal blocking, (ii) extending from the base wall, and (iii) defining a plurality of rows and columns, the plurality of rows and columns forming compartments to hold the plurality of PCDs, each compartment including an indicium;
 a plurality of portable markers associated with each compartment, each of the plurality of portable markers indicating one of the indicia of the compartments; and
 a lid configured to be moveable with respect to the housing so as to enable the users to (i) place the PCD's into the housing and (ii) securely and releasably close the lid onto the housing, the lid also including a conductive material so that when the lid is closed onto the housing, the holder is data signal blocking, preventing a data signal from reaching the PCD's.

19. The PCD holder assembly of claim 18, which is configured to be bolted to or built as part of a larger structure.

20. The PCD holder assembly of claim 18, wherein each said indicium includes at least one of a unique visual (ii) number or (iii) image.

21. The PCD holder assembly of claim 18, wherein the base wall and the at least one side wall of the housing include a preexisting conductive layer forming the conductive material, the preexisting conductive layer fitted within a preexisting insulating layer.

22. The PCD holder assembly of claim 21, wherein the preexisting layers are adhered, heat sealed and/or manually pressed together.

23. The PCD holder of claim 1, wherein the separate material is further configured to contact and hold the PCD snugly within the holder.

24. The PCD holder of claim 1, wherein the separate material is laminated to one of the housing and the lid.

25. The PCD holder of claim 15, wherein the inhibiting structure is of a foam or gasket material.

26. The PCD holder of claim 15, wherein the inhibiting structure includes a cutout in the first housing.

* * * * *